(12) United States Patent
Conti et al.

(10) Patent No.: US 11,011,582 B2
(45) Date of Patent: May 18, 2021

(54) THREE-DIMENSIONAL MEMORY ARRAY

(71) Applicant: Micron Technology, Inc., Boise, ID (US)

(72) Inventors: Anna Maria Conti, Milan (IT); Andrea Redaelli, Casatenovo (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/785,026

(22) Filed: Feb. 7, 2020

(65) Prior Publication Data

US 2020/0176512 A1    Jun. 4, 2020

Related U.S. Application Data

(63) Continuation of application No. 16/156,194, filed on Oct. 10, 2018, now Pat. No. 10,593,730.

(51) Int. Cl.
| | | |
|---|---|---|
| *G11C 13/00* | (2006.01) | |
| *H01L 27/24* | (2006.01) | |
| *H01L 45/00* | (2006.01) | |

(52) U.S. Cl.
CPC .......... *H01L 27/249* (2013.01); *G11C 13/004* (2013.01); *G11C 13/0026* (2013.01); *G11C 13/0028* (2013.01); *G11C 13/0069* (2013.01); *H01L 27/2454* (2013.01); *H01L 45/1233* (2013.01); *H01L 45/144* (2013.01); *H01L 45/1683* (2013.01)

(58) Field of Classification Search
CPC . G11C 11/16; G11C 13/0069; G11C 13/0028; G11C 13/004; G11C 13/0026; G11C 2213/71; G11C 13/0004; G11C 13/003; H01L 27/249; H01L 27/2454; H01L 45/144; H01L 45/1233; H01L 45/1683; H01L 45/16; H01L 45/1226; H01L 45/143
USPC .................................................. 365/148, 171
See application file for complete search history.

(56) References Cited

U.S. PATENT DOCUMENTS

| | | |
|---|---|---|
| 7,456,439 B1 | 11/2008 | Horch |
| 8,729,523 B2 | 5/2014 | Pio |
| 8,841,649 B2 | 9/2014 | Pio |
| 8,878,278 B2 | 11/2014 | Alsmeier |
| 9,397,110 B2 | 7/2016 | Lue |
| 9,978,810 B2 | 5/2018 | Pellizzer |

(Continued)

OTHER PUBLICATIONS

International Search Report and Written Opinion from related International Application Serial No. PCT/US2019/051228, dated Jan. 10, 2020, 12 pages.

*Primary Examiner* — Michael T Tran
(74) *Attorney, Agent, or Firm* — Brooks, Cameron & Huebsch, PLLC

(57) ABSTRACT

An example three-dimensional (3-D) memory array includes a first plurality of conductive lines separated from one other by an insulation material, a second plurality of conductive lines, and a plurality of pairs of conductive pillars arranged to extend substantially perpendicular to the first plurality of conductive lines and the second plurality of conductive lines. The conductive pillars of each respective pair are coupled to a same conductive line of the second plurality of conductive lines. A storage element material is formed partially around the conductive pillars of each respective pair.

19 Claims, 14 Drawing Sheets

SECTION F-F

(56) References Cited

U.S. PATENT DOCUMENTS

| | | | |
|---|---|---|---|
| 10,096,655 B1 | 10/2018 | Pellizzer et al. | |
| 10,141,331 B1 | 11/2018 | Susuki | |
| 2006/0166443 A1 | 7/2006 | Forbes | |
| 2008/0180982 A1* | 7/2008 | Nejad | G11C 11/16 365/63 |
| 2008/0247072 A1* | 10/2008 | Nozieres | H01L 43/08 360/59 |
| 2008/0277720 A1 | 11/2008 | Youn | |
| 2009/0310425 A1 | 12/2009 | Sim | |
| 2010/0027314 A1* | 2/2010 | Chevallier | G11C 11/16 365/148 |
| 2010/0200906 A1 | 8/2010 | Kidoh | |
| 2011/0103149 A1 | 5/2011 | Katsumata | |
| 2011/0103153 A1 | 5/2011 | Katsumata | |
| 2011/0133151 A1 | 6/2011 | Li | |
| 2012/0273862 A1 | 11/2012 | Tanzawa | |
| 2013/0062685 A1 | 3/2013 | Yasuda | |
| 2013/0198440 A1 | 8/2013 | Oh | |
| 2013/0235667 A1 | 9/2013 | Nam | |
| 2013/0322171 A1* | 12/2013 | Lee | G11C 11/5628 365/185.03 |
| 2014/0014889 A1 | 1/2014 | Shim | |
| 2014/0217349 A1 | 8/2014 | Hopkins | |
| 2015/0003157 A1 | 1/2015 | Aritome | |
| 2015/0060992 A1 | 3/2015 | Taekyung | |
| 2015/0179271 A1* | 6/2015 | Nam | G11C 16/0483 365/218 |
| 2016/0004437 A1 | 1/2016 | Kim et al. | |
| 2016/0005762 A1 | 1/2016 | Lue | |
| 2016/0078946 A1* | 3/2016 | Byun | G11C 16/0483 365/185.12 |
| 2016/0133638 A1 | 5/2016 | Simsek-Ege | |
| 2016/0133836 A1 | 5/2016 | Lan | |
| 2016/0148947 A1 | 5/2016 | Seo | |
| 2016/0233224 A1 | 8/2016 | Rhie | |
| 2016/0260733 A1 | 9/2016 | Lue | |
| 2016/0358660 A1 | 12/2016 | Nam | |
| 2017/0069656 A1 | 3/2017 | Minami | |
| 2017/0069658 A1 | 3/2017 | Yamada | |
| 2017/0077124 A1 | 3/2017 | Shimojo | |
| 2017/0125438 A1 | 5/2017 | Pachamuthu | |
| 2017/0169895 A1* | 6/2017 | Terabayashi | G11C 16/08 |
| 2017/0170190 A1 | 6/2017 | Zhu | |
| 2017/0200734 A1 | 7/2017 | Fujiki | |
| 2017/0229577 A1 | 8/2017 | Matsuura | |
| 2017/0236779 A1 | 8/2017 | Komori | |
| 2017/0243879 A1 | 8/2017 | Yu | |
| 2017/0243881 A1 | 8/2017 | Shin | |
| 2018/0006049 A1 | 1/2018 | Inomata | |
| 2018/0053568 A1* | 2/2018 | Yamauchi | G06F 12/0246 |
| 2018/0069016 A1 | 3/2018 | Barbato | |
| 2018/0069018 A1 | 3/2018 | Barbato | |
| 2018/0082743 A1 | 3/2018 | Bushnaq | |
| 2018/0158834 A1 | 6/2018 | Ogawa et al. | |
| 2018/0240525 A1 | 8/2018 | Shin | |
| 2018/0261616 A1 | 9/2018 | Cho | |
| 2018/0269222 A1 | 9/2018 | Huang | |
| 2018/0307431 A1 | 10/2018 | Gunnam | |
| 2018/0331041 A1 | 11/2018 | Liao | |
| 2018/0350832 A1 | 12/2018 | Barbato | |
| 2018/0358102 A1 | 12/2018 | Zhang | |
| 2019/0051372 A1* | 2/2019 | Kim | G11C 29/52 |
| 2019/0065114 A1 | 2/2019 | Inoue | |
| 2019/0067205 A1 | 2/2019 | Rae | |
| 2019/0096808 A1 | 3/2019 | Tsutsumi | |
| 2019/0189629 A1 | 6/2019 | Parekh | |
| 2019/0198519 A1 | 6/2019 | Economy | |
| 2019/0198568 A1 | 6/2019 | Oda | |
| 2019/0206508 A1* | 7/2019 | Choi | G11C 11/5635 |
| 2019/0214095 A1* | 7/2019 | Sudo | G11C 29/04 |

* cited by examiner

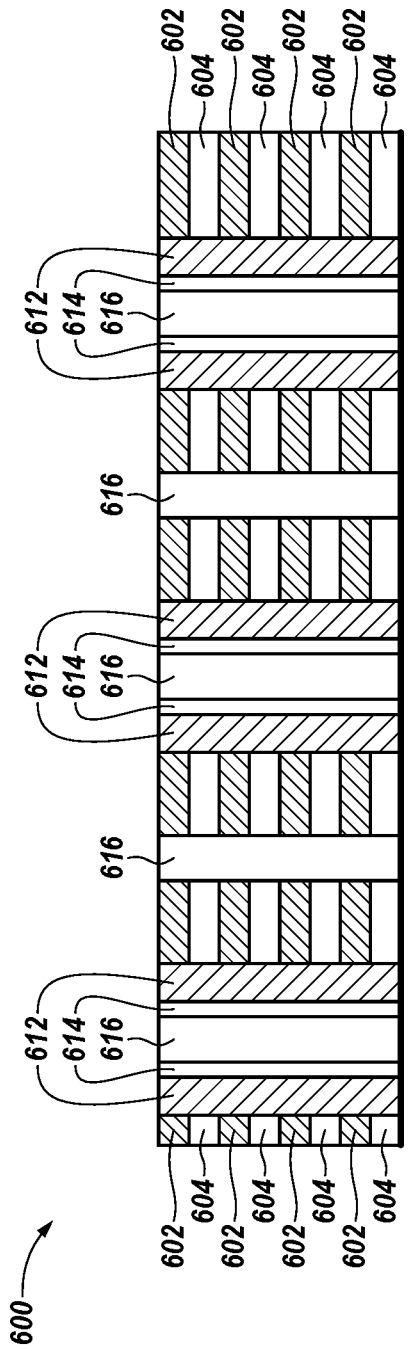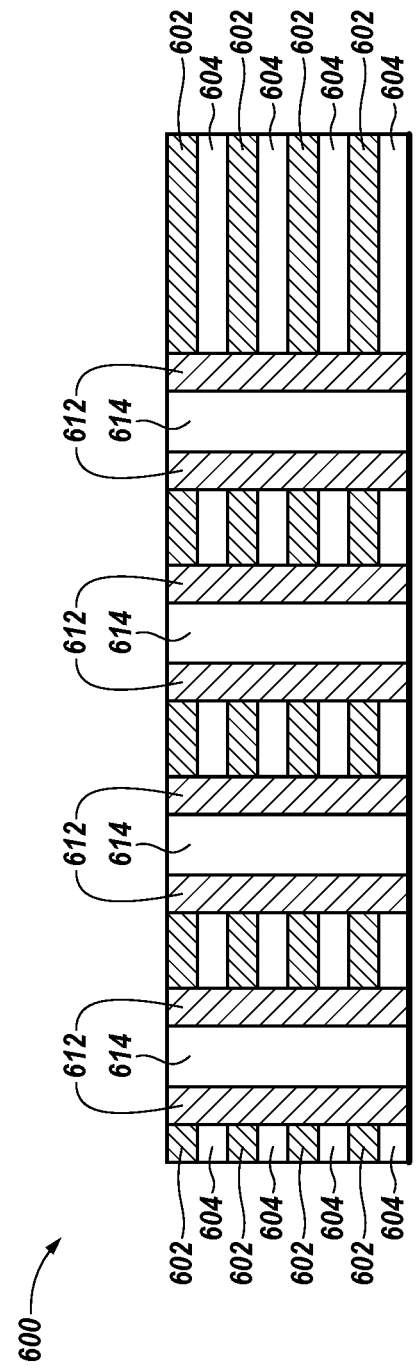

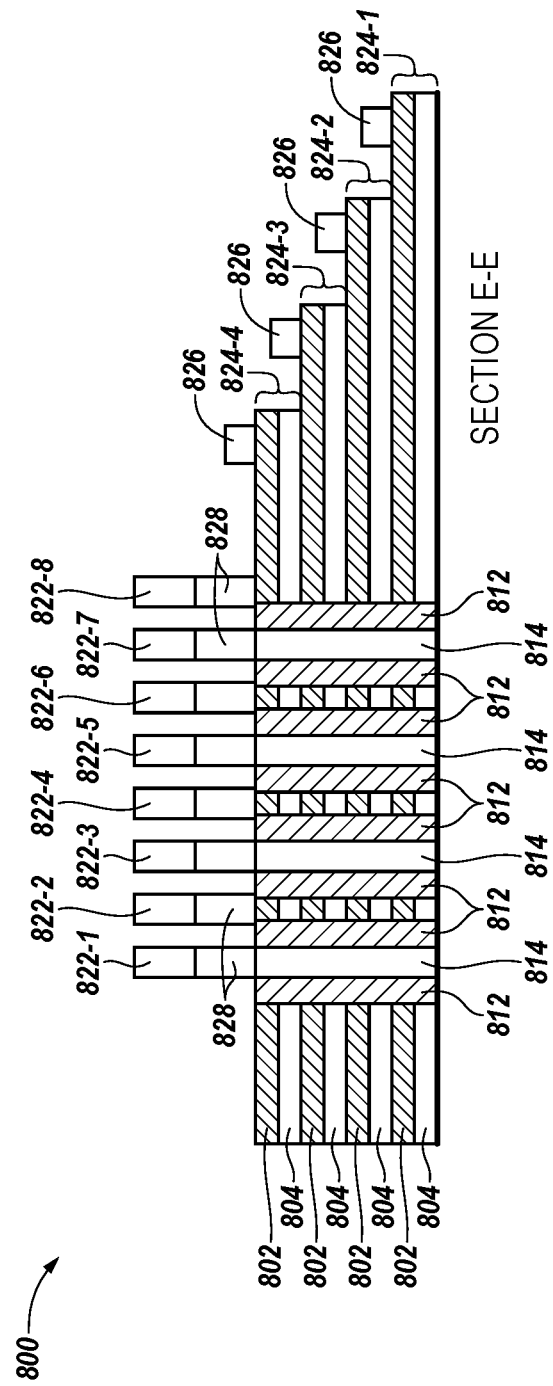

THREE-DIMENSIONAL MEMORY ARRAY

PRIORITY INFORMATION

This application is a continuation of U.S. application Ser. No. 16/156,194, filed on Oct. 10, 2018, now issued as U.S. Pat. No. 10,593,730, issued on Mar. 17, 2020, the contents of which are incorporated herein by reference.

TECHNICAL FIELD

The present disclosure relates generally to semiconductor memory and methods, and more particularly, to three-dimensional (3-D) memory arrays.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells because each cell can represent more than one digit (e.g., more than one bit).

BRIEF DESCRIPTION OF THE DRAWINGS

FIGS. 6A-6C illustrate various views of a subsequent processing step associated with forming the 3-D memory array in accordance with an embodiment of the present disclosure.

FIGS. 8A and 8B illustrate various views of a subsequent processing step associated with forming the 3-D memory array in accordance with an embodiment of the present disclosure.

DETAILED DESCRIPTION

Figure 1:
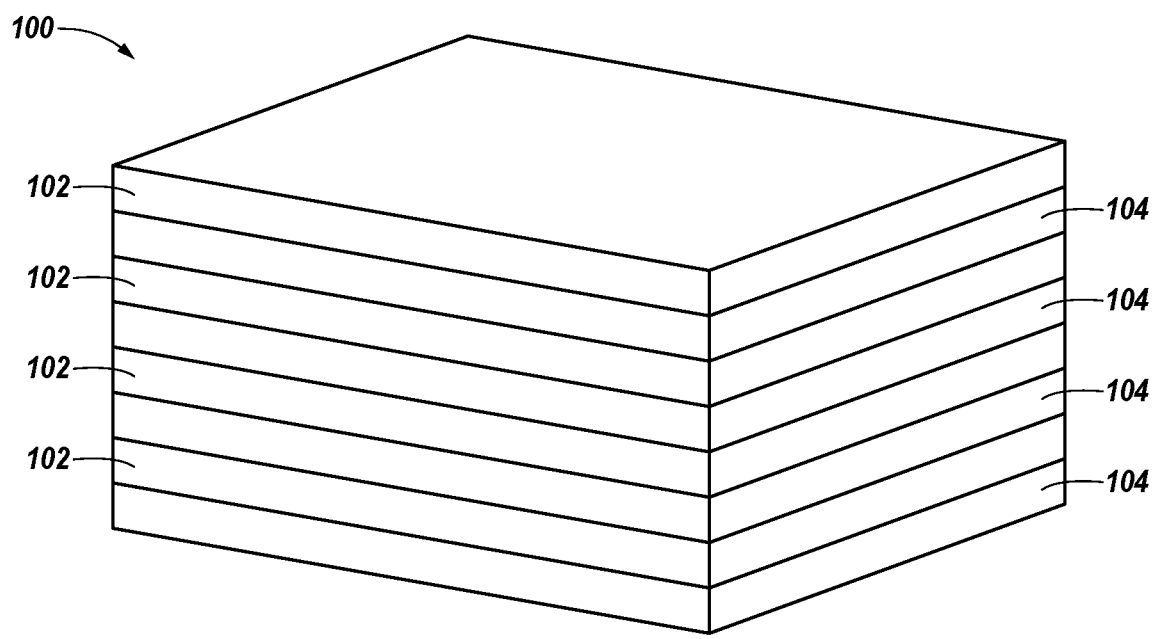
FIG. 1 illustrates a perspective view of a processing step associated with forming a three dimensional (3-D) memory array in accordance with an embodiment of the present disclosure.

The present disclosure includes 3-D memory arrays, and methods of processing the same. A number of embodiments include a first plurality of conductive lines separated from one other by an insulation material, a second plurality of conductive lines, a plurality of pairs of conductive pillars arranged to extend substantially perpendicular to the first plurality of conductive lines and the second plurality of conductive lines, wherein the conductive pillars of each respective pair are coupled to a same conductive line of the second plurality of conductive lines, and a storage element material formed partially around the conductive pillars of each respective pair.

A 3-D memory array in accordance with the present disclosure can have an increased density of memory cells (e.g., increased bit density) as compared with previous 3-D memory arrays. For example, the density of memory cells of a 3-D memory array in accordance with the present disclosure can be increased by at least 15% as compared with the density of memory cells of previous 3-D memory arrays. Further, the density of memory cells per conductive line in a 3-D memory array in accordance with the present disclosure can be double that of previous 3-D memory arrays.

A 3-D memory array in accordance with the present disclosure includes a staggered arrangement of openings through alternating layers of conductive line material and insulation material. The staggered arrangement decreases the spacing between the openings while maintaining a dielectric thickness to sustain the voltage(s) to be applied to the 3-D memory array.

A storage element material and a conductive pillar is formed in each of the openings. Another opening (e.g., a cut) is formed through the alternating layers of conductive line material and insulation material, the storage element material, and the conductive pillar. The other opening increases the number of memory cells, reduces the capacitance of each floor of the 3-D memory array, and reduces the disturbances between adjacent floors of the 3-D memory array. A metal material (e.g., vias) is coupled to the conductive pillars in an orthogonal orientation relative to the other opening such that each memory cell of the 3-D memory array is addressed univocally by a pair of conductive lines of the 3-D memory array (e.g., a bit line and a word line). That is, each memory cell of the 3-D memory array has only one possible address (e.g., one bit line of a plurality of bit lines and one word line of a plurality of word lines). As a result, the quantity of drivers for decoding a 3-D memory array in accordance with the present disclosure can be reduced as compared with the quantity of drivers for decoding previous 3-D memory arrays. For example, the quantity of drivers for decoding a 3-D memory array in accordance with the present disclosure can be reduced by a factor of at least sixty as compared with the quantity of drivers for decoding previous 3-D memory arrays.

As used herein, "a" or "an" can refer to one or more of something, and "a plurality of" can refer to more than one of such things. For example, a memory cell can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2.

FIG. 1 illustrates a perspective view of a processing step associated with forming a 3-D memory array 100 in accordance with an embodiment of the present disclosure. FIG. 1 shows a plurality of planes of a conductive line material 102 separated in a z-direction (e.g., separated vertically) from one another by a plurality of planes of an insulation material 104. For example, a first plane (e.g., a bottom plane) of the insulation material 104 can be formed (e.g., deposited) over an etch stop (e.g., substrate) material (not shown in FIG. 1), and then a plane of the conductive line material 102 can be formed on the first plane of the insulation material 104. Additional planes of the insulation material 104 can be formed on the conductive line material 102 in an alternating manner as illustrated in FIG. 1.

Each respective one of the plurality of planes of the conductive line material 102 can be at (e.g., form) a different level of the 3-D memory array, hereinafter referred to as a floor of the 3-D memory array. The conductive line material 102 can comprise (e.g., be formed of) a metallic (or semi-metallic) material or a semiconductor material such as a doped polysilicon material, among others. Examples of the insulation material 104 include, but are not limited to dielectric materials, such as silicon oxide. Four planes of the conductive line material 102 and the insulation material 104, respectively, are shown in FIG. 1. However, the quantity of planes of the conductive line material 102 and the insulation material 104 are not limited to this quantity; the conductive line material 102 and the insulation material 104 can be arranged into more, or fewer, floors.

Figure 2:
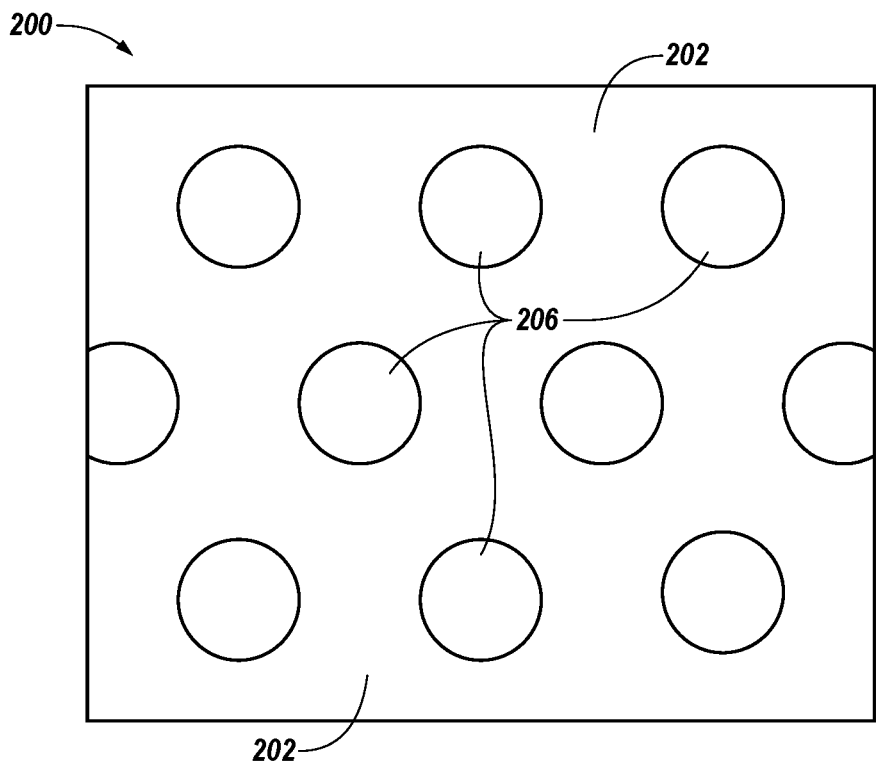
FIG. 2 illustrates a top view of a subsequent processing step associated with forming the 3-D memory array in accordance with an embodiment of the present disclosure.

FIG. 2 illustrates a top view of a subsequent processing step associated with forming the 3-D memory array 200 in accordance with an embodiment of the present disclosure. As shown in FIG. 2, a plurality of openings (e.g., holes) 206 can be formed (e.g., etched and/or patterned) through the alternating planes of the insulation material 204 (not shown in FIG. 2) and the conductive line material 202. For example, the plurality of openings 206 can be formed through the conductive line material 202 such that at least a portion of each respective one of the plurality of openings 206 passes through each respective plane of the conductive line material 202. Portions of the conductive line material 202 can be removed such that the resulting area of the conductive line material 202 may exclude the portions removed by forming the plurality of openings 206. The plurality of openings 206 can be formed via a lithographic process; however, embodiments in accordance with the present disclosure are not so limited. Each of the plurality of openings 206 can be formed at the same time. For instance, each of the plurality of openings 206 can be formed in a single etch and/or pattern using a single mask.

Each of the plurality of openings 206 are formed to have a diameter that is smaller than that necessary to have a sufficient thickness of storage element material for a memory cell of the 3-D memory array 200. The smaller diameter at the processing step illustrated in FIG. 2 enables the density of memory cells to be increased (e.g., maximized) while maintaining the electrical performance requirements (e.g., minimum dielectric thickness) of the 3-D memory array 200. In an embodiment, the diameter of the plurality of openings 206 can be in the range of twenty-five nanometers (nm) and forty nm, inclusive.

As shown in FIG. 2, the plurality of openings 206 are formed in a staggered arrangement with equal spacing between each of the plurality of openings 206. The staggered arrangement can be a hexagonal arrangement. For example, a respective one of the plurality of openings 206 can be surrounded by six other openings of the plurality of openings 206. The hexagonal arrangement of the plurality of openings shown in FIG. 2 is discussed further in association with FIG. 5 below.

Figure 3:
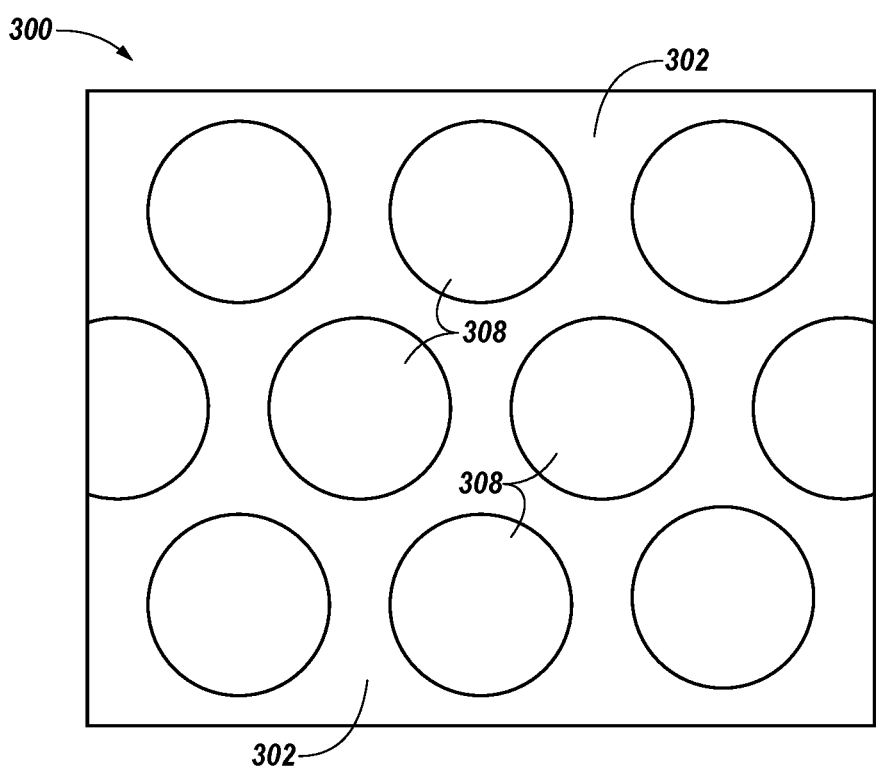
FIG. 3 illustrates a top view of a subsequent processing step associated with forming the 3-D memory array in accordance with an embodiment of the present disclosure.

FIG. 3 illustrates a top view of a subsequent processing step associated with forming the 3-D memory array 300 in accordance with an embodiment of the present disclosure. As shown in FIG. 3, the plurality of openings 206 illustrated in FIG. 2 are enlarged, via an etching process, for example, to form the enlarged openings 308. The diameter of the plurality of openings 206 is increased to reduce the space between each respective one of the plurality of enlarged openings 308 while maintaining the minimum dielectric thickness to sustain the voltages to be applied to the 3-D memory array 300. In an embodiment, the diameter of the plurality of enlarged openings 308 can be in the range of forty nm and eighty nm, inclusive. The ratio of the diameter of the plurality of enlarged openings 308 to the diameter of the plurality of openings 206 can be at most 1.6.

Figure 4:
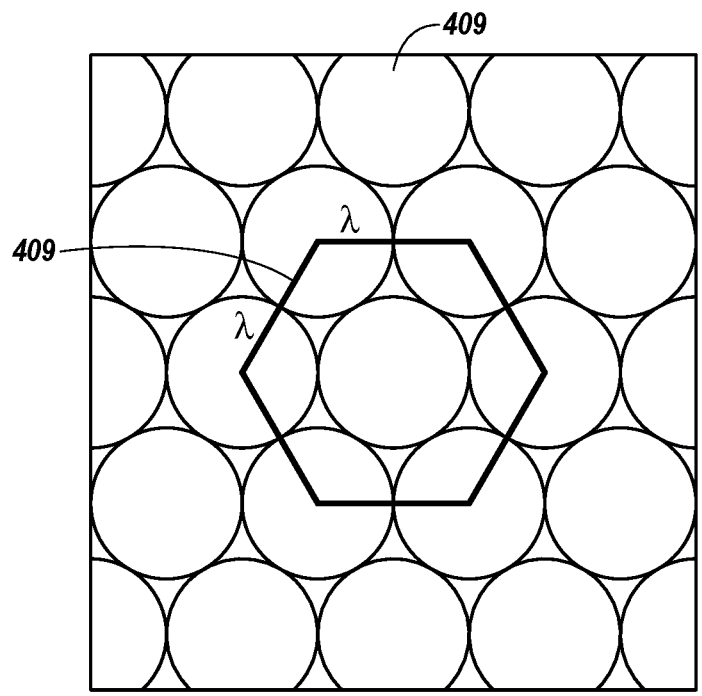
FIG. 4 illustrates a top view of an arrangement of a plurality of openings in accordance with an embodiment of the present disclosure.

FIG. 4 illustrates a top view of an arrangement of a plurality of openings 408 in accordance with an embodiment of the present disclosure. In contrast to previous approaches in which openings are formed in line with each other in a rectangular arrangement, the plurality of openings 408 are formed in a staggered, hexagonal arrangement. As used herein, "a rectangular arrangement" refers to a plurality of openings that are adjacent to one another in both the x-direction (e.g., rows) and the y-direction (e.g., columns). As illustrated in FIG. 4, the plurality of openings 408 are adjacent to each other and in line with each other in an x-direction (e.g., rows). However, the plurality of openings 408 are not adjacent to each other in the y-direction. The plurality of openings 408 are in line with each other in the y-direction (e.g., columns) but the plurality of openings 408 alternate (e.g., skip) rows in the y-direction.

The hexagon 409 represents a unit of area having edges of length $\lambda$. The six vertices of the hexagon 409 are positioned at respective center of six openings of the plurality of openings 408. The six openings surround another one of the plurality of openings 408. As illustrated in FIG. 4, the hexagon 409 includes the center one of the plurality of openings 408 and a third (⅓) of each of the six surrounding openings. Thus, the hexagon 409 encompasses three openings of the plurality of openings 408. The area of a hexagon can be expressed as $3\sqrt{3}/2\lambda^2$. Thus, the density of the plurality of openings 408 is 3 openings/$(3\sqrt{3}/2\lambda^2)$, which can be simplified to $2/\sqrt{3}$ openings/$\lambda^2$ or approximately 1.15 openings/$\lambda^2$. The density of the plurality of openings 408 is approximately 15% greater that the density of the openings formed in line with each other in a rectangular arrangement, in which the density of the openings would be 1 opening/$\lambda^2$.

Figure 5A:
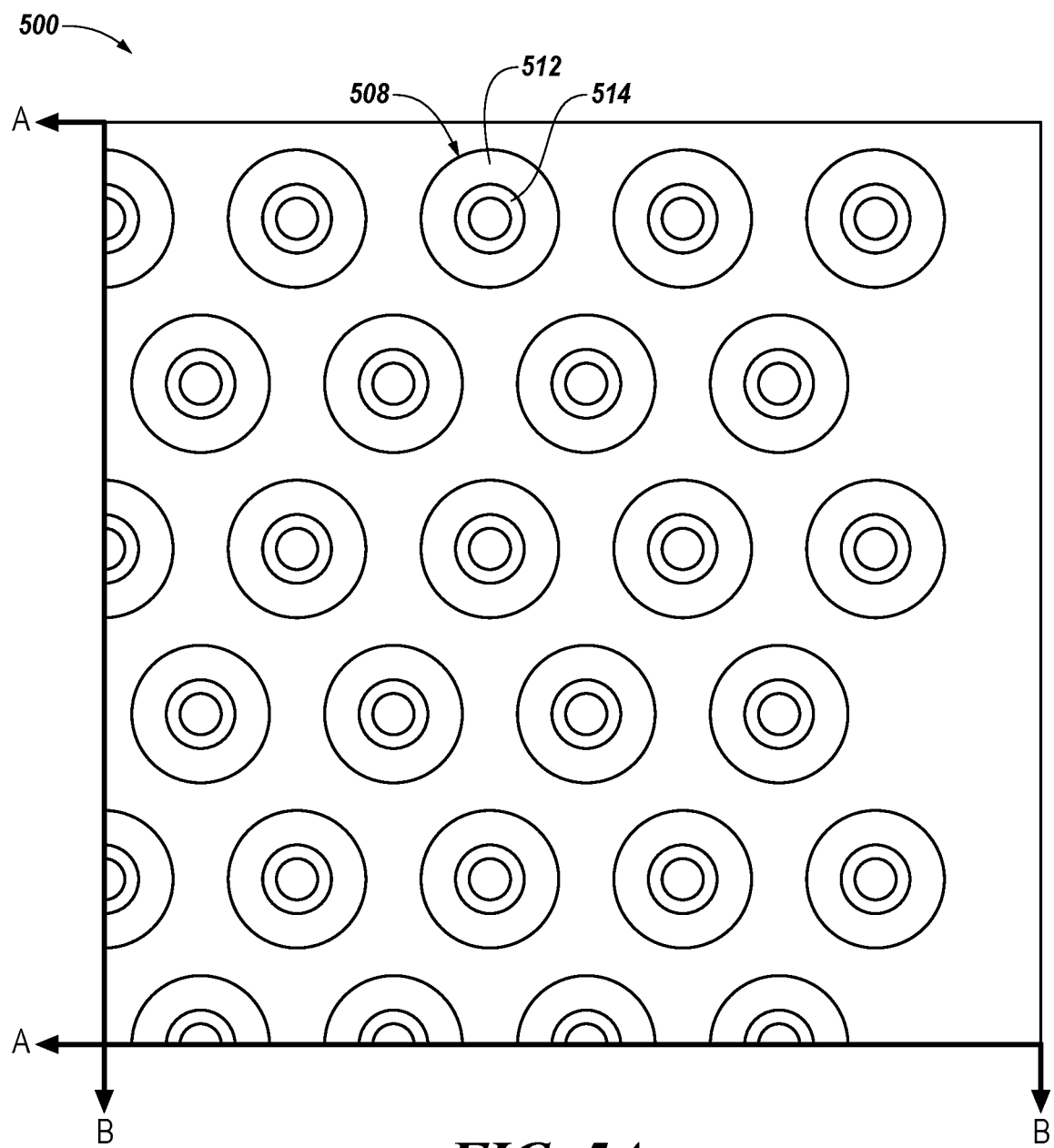
FIGS. 5A-5C illustrate various views of a subsequent processing step associated with forming the 3-D memory array in accordance with an embodiment of the present disclosure.
Figure 5B:
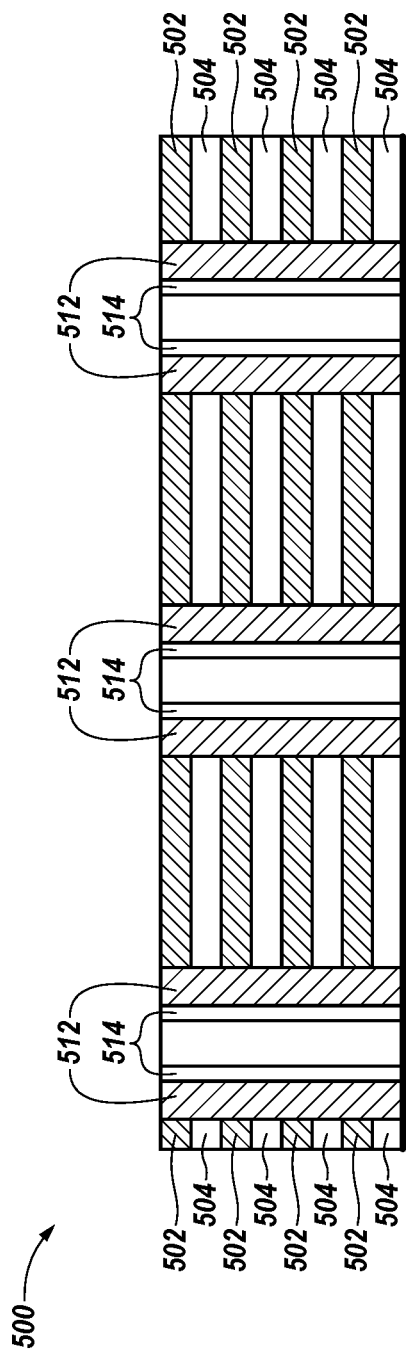
Figure 5C:
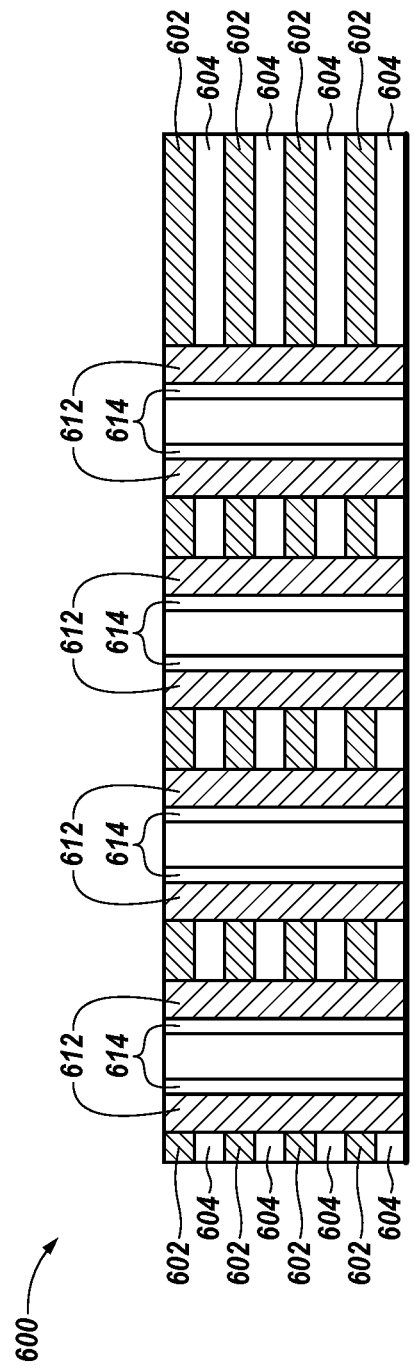

FIGS. 5A-5C illustrate various views of a subsequent processing step associated with forming the 3-D memory array 500 in accordance with an embodiment of the present disclosure. FIG. 5A illustrates a top view of the 3-D memory array 500 after the subsequent processing step. FIG. 5B illustrates a schematic cross-sectional view of the 3-D memory array 500 along section line A-A after the subsequent processing step. FIG. 5C illustrates a schematic cross-sectional view of the 3-D memory array 500 along section line B-B after the subsequent processing step.

As shown in FIGS. 5A-5C, each of the plurality of enlarged openings 508 can be filled by forming (e.g., depositing) a storage element material 512 along a sidewall of each respective one of the plurality of enlarged openings 508. The storage element material 512 can be a chalcogenide material, such as a chalcogenide alloy and/or glass, that can serve as a self-selecting storage element material (e.g., a material that can serve as both a select device and a storage element). For example, the storage element material 512 can be responsive to an applied voltage, such as a program pulse, applied thereto. For an applied voltage that is less than a threshold voltage, the storage element material 512 may remain in an electrically nonconductive state (e.g., an "off" state). Alternatively, responsive to an applied voltage that is greater than the threshold voltage, the storage element material 512 may enter an electrically conductive state (e.g., an "on" state). Further, the threshold voltage of the storage element material 512 in a given polarity can change based on the polarity (e.g., positive or negative) of the applied voltage. For instance, the threshold voltage can change based on whether the polarity of the program pulse is positive or negative.

Examples of chalcogenide materials that can serve as the storage element material 512 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. The hyphenated chemical composition notation, as used herein, indicates the elements included in a particular mixture or compound, and is intended to represent all stoichiometries involving the indicated elements.

As shown in FIGS. 5A-5C, a conductive pillar (e.g., tube) 514 can be formed in each respective one of the plurality of enlarged openings 508 adjacent (e.g., in contact with) the storage element material 512 that was formed therein. The conductive pillar 514 may be referred to as a second conductive line material herein. The storage element material 512 is concentrically formed around the conductive pillar 514. The conductive pillar 514 can be an electrode cylinder. The conductive pillar 514 can comprise a metallic (or semi-metallic) material or a semiconductor material such as a doped polysilicon material, among others. The conductive pillar 514 can comprise the conductive line material 502. However, other metallic, semi-metallic, or semiconductor materials can be used.

In the embodiment illustrated in FIGS. 5A-5C, the storage element material 512 and the conductive pillar 514 formed in each respective one of the plurality of enlarged openings 508 are arranged to extend substantially perpendicular to the plurality of planes of the conductive line material 502 and the plurality of planes of the insulation material 504. The storage element material 512 and the conductive pillar 514 formed in each respective one of the plurality of enlarged openings 508 are concentrically formed in a substantially circular shape. However, embodiments of the present disclosure are not limited to exact or quasi-exact circular shapes. For instance, as used herein, "concentric" can refer to structures that are substantially surrounding each other in any shape, including oval shapes, for instance.

Although not shown in FIGS. 5A-5C for clarity and so as not to obscure embodiments of the present disclosure, in some instances a portion of storage element material 512 and a portion of conductive pillar 514 can be formed on (e.g., cover) the bottom of each respective one of the plurality of enlarged openings 508 when the storage element material 512 and the conductive pillar 514 are deposited therein. Although, the conductive pillar 514 is shown to have a hollow center (e.g., a tube), embodiments of the present disclosure are not so limited such that the conductive pillar 514 can have a solid center.

Figure 6A:
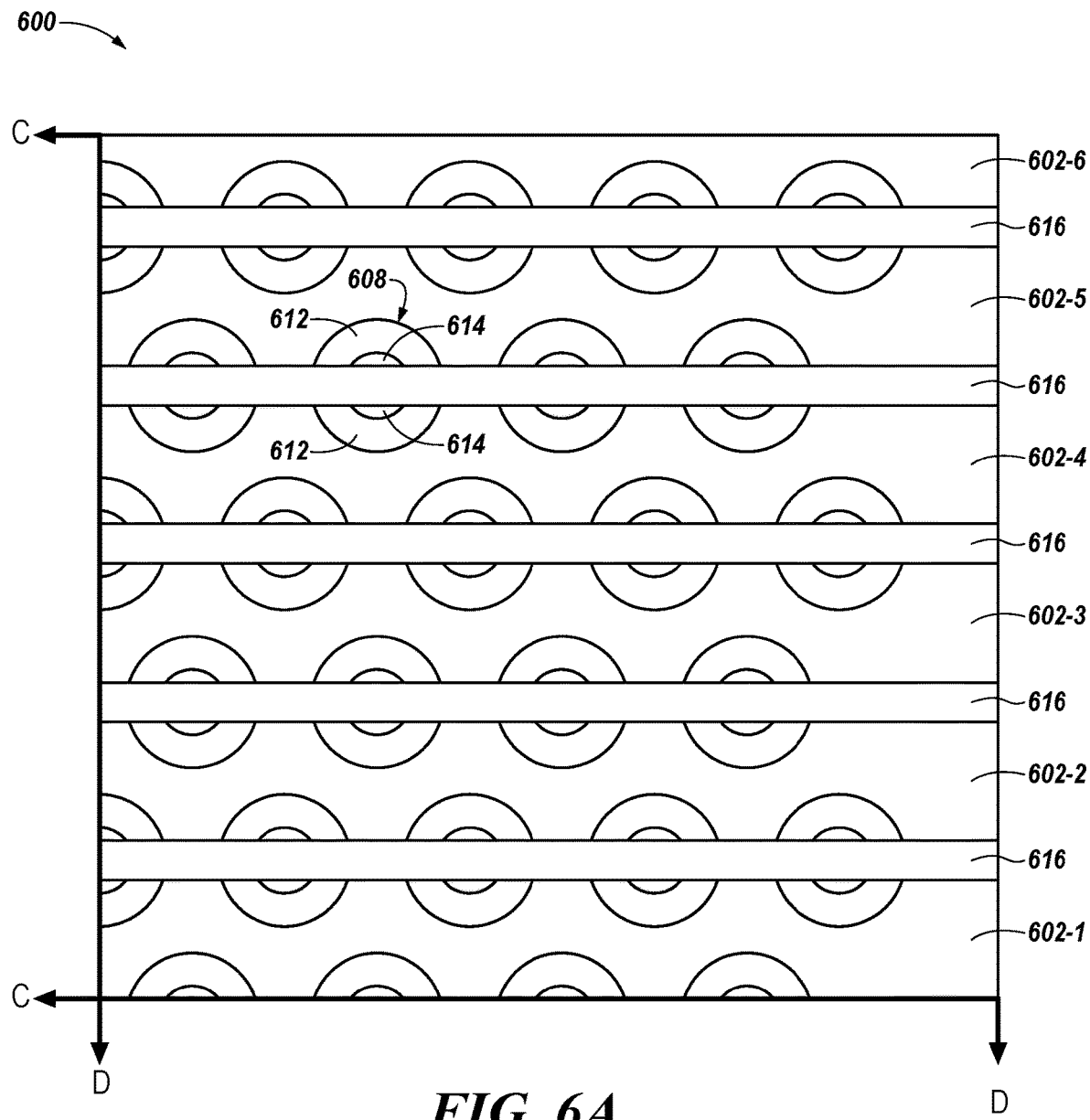

FIGS. 6A-6C illustrate various views of a subsequent processing step associated with forming the 3-D memory array 600 in accordance with an embodiment of the present disclosure. FIG. 6A illustrates a top view of the 3-D memory array 600 after the subsequent processing step. FIG. 6B illustrates a schematic cross-sectional view of the 3-D memory array 600 along section line C-C after the subsequent processing step. FIG. 6C illustrates a schematic cross-sectional view of the 3-D memory array 600 along section line D-D after the subsequent processing step.

As shown in FIGS. 6A-6C, a plurality of additional openings (e.g., cuts) 616 can be formed through the conductive pillar 614 and the storage element material 612 formed in each respective one of the plurality of enlarged openings 608, the plurality of planes of the conductive line material 602, and the plurality of planes of the insulation material 604. The plurality of additional openings 616 are formed in the minimum distance between the plurality of enlarged openings 608 direction. That is, the plurality of additional openings can be formed in three equivalent minimum distance directions of the staggered (e.g., hexagonal) arrangement of the plurality of enlarged openings 608: horizontally as shown in FIG. 6A, diagonally from the top left to the bottom right, or diagonally from the top right to the bottom left.

The plurality of additional openings 616 are arranged to extend substantially perpendicular to the plurality of planes of the conductive line material 602 and the plurality of planes of the insulation material 604. The plurality of additional openings 616 are arranged to coincide with the center point of the plurality of enlarged openings 608 so as to effectively bisect (e.g., cut in half) the storage element material 612 and the conductive pillar 614 formed in each respective one of the plurality of enlarged openings 608. Thus, each respective one of the plurality of additional openings 616 has a pair of conductive pillars formed therein.

The width of the plurality of additional openings 616 can be greater than the diameter of the hollow center of the conductive pillar 514 illustrated in FIGS. 5A-5C. Thus, each half of the conductive pillar 614 formed in each respective one of the plurality of enlarged openings 608 can have a substantially curved (e.g., semicircular surface adjacent to a half of the storage element material 612) and a substantially flat face adjacent to the plurality of additional openings 616. The curved surfaces of the bisected storage element material 612 have a different surface area than the flat face bisected storage element material 612, which can help with the window enlargement. The window can be improved if the storage element material 612 has different dimensions on opposite faces (e.g., the curved surface of the storage element material 612 opposite the flat surface of the storage element material 612 opposite).

Each respective one of the plurality of additional openings 616 can be filled by forming (e.g., depositing) an insulation material in each respective one of the plurality of additional openings 616. For instance, each respective one of the plurality of additional openings 616 can be completely filled with an insulation material. The insulation material formed in the plurality of additional openings 616 can comprise the insulation material 602 or a different insulation material. The insulation material formed in the plurality of additional openings 616 can be a dielectric material, such as silicon oxide. The insulation material formed in the plurality of additional openings 616 can be silicon nitride.

As shown in FIG. 6A, the plurality of additional openings 616 cut the planes of the conductive line material 602 in a plurality of conductive lines 602-1, 602-2, 602-3, 602-4, 602-5, and 602-6, which may be referred to the plurality of conductive lines 602 herein. For instance, the conductive line material 602 formed in the plurality of planes can comprise the plurality of conductive lines 602 after the processing step illustrated in FIGS. 6A-6C. As such, the halves of the storage element material 612 and the conductive pillar 614 formed in each respective one of the plurality of enlarged openings 608 can comprise a vertical stack of the 3-D memory array 600. That is, the 3-D memory array 600 can include a plurality of vertical stacks. Each respective stack can include a first conductive pillar 614 (e.g., half of the conductive pillar 514 illustrated in FIGS. 5A-5C), a second conductive pillar 614 (e.g., the other half of the conductive pillar 514), and the storage element material 612 formed partially around the first conductive pillar 614 and partially around the second conductive pillar 614, and separated by the insulation material formed in the plurality of additional openings 616.

Although not shown in FIGS. 6A-6C for clarity and so as not to obscure embodiments of the present disclosure, other materials may be formed before, after, and/or between the storage element material 612, and/or the conductive pillar 614, for example, to form adhesion layers or barriers against interdiffusion of materials and/or to mitigate composition mixing. Further, in the embodiment illustrated in FIGS. 6A-6C, any portion of the storage element material 612 and/or the conductive pillar 614 that may have formed above the uppermost plane of the conductive line material 602 has been removed by etching and/or chemical-mechanical polishing (CMP), for example, to isolate each respective conductive pillar 614 from each other.

Figure 7:
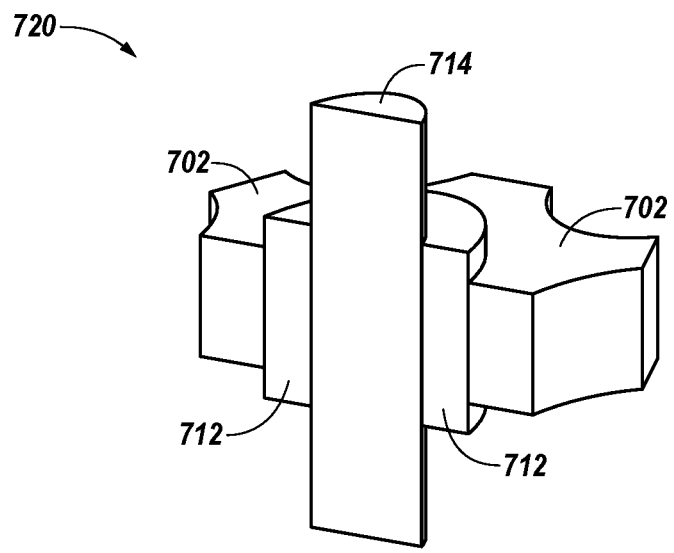
FIG. 7 illustrates a memory cell of the 3-D memory array illustrated in FIGS. 6A-6C in accordance with an embodiment of the present disclosure.

FIG. 7 illustrates a memory cell 720 of the 3-D memory array 600 illustrated in FIGS. 6A-C in accordance with an embodiment of the present disclosure. As shown in FIG. 7, each respective memory cell 720 of the 3-D memory array 600 includes a portion of one of the plurality of planes of the conductive line material 702 (e.g., a portion of a conductive line 702) and a portion of one conductive pillar 714 of the pair of conductive pillars 614 formed in a respective one of the plurality of enlarged openings 608. Each respective memory cell 720 of the 3-D memory array 600 also includes a portion of the storage element material 712 formed in the respective one of the plurality of enlarged openings 608 that is between the conductive line 702 and the portion of the conductive pillar 714. The conductive line 702 is substantially coplanar with, but electrically decoupled from, the portion of the conductive pillar 714. Thus, each respective memory cell 720 is substantially co-planar to the portion of its respective conductive line 702.

Referring back to FIGS. 6A-6C, each respective one of the plurality of enlarged openings includes two memory cells 720 per floor of the 3-D memory array 600 as a result of the formation of the plurality of additional openings 616. Thus, the quantity of the memory cells 720 is doubled by the formation of the plurality of additional openings 616.

Figure 8A:
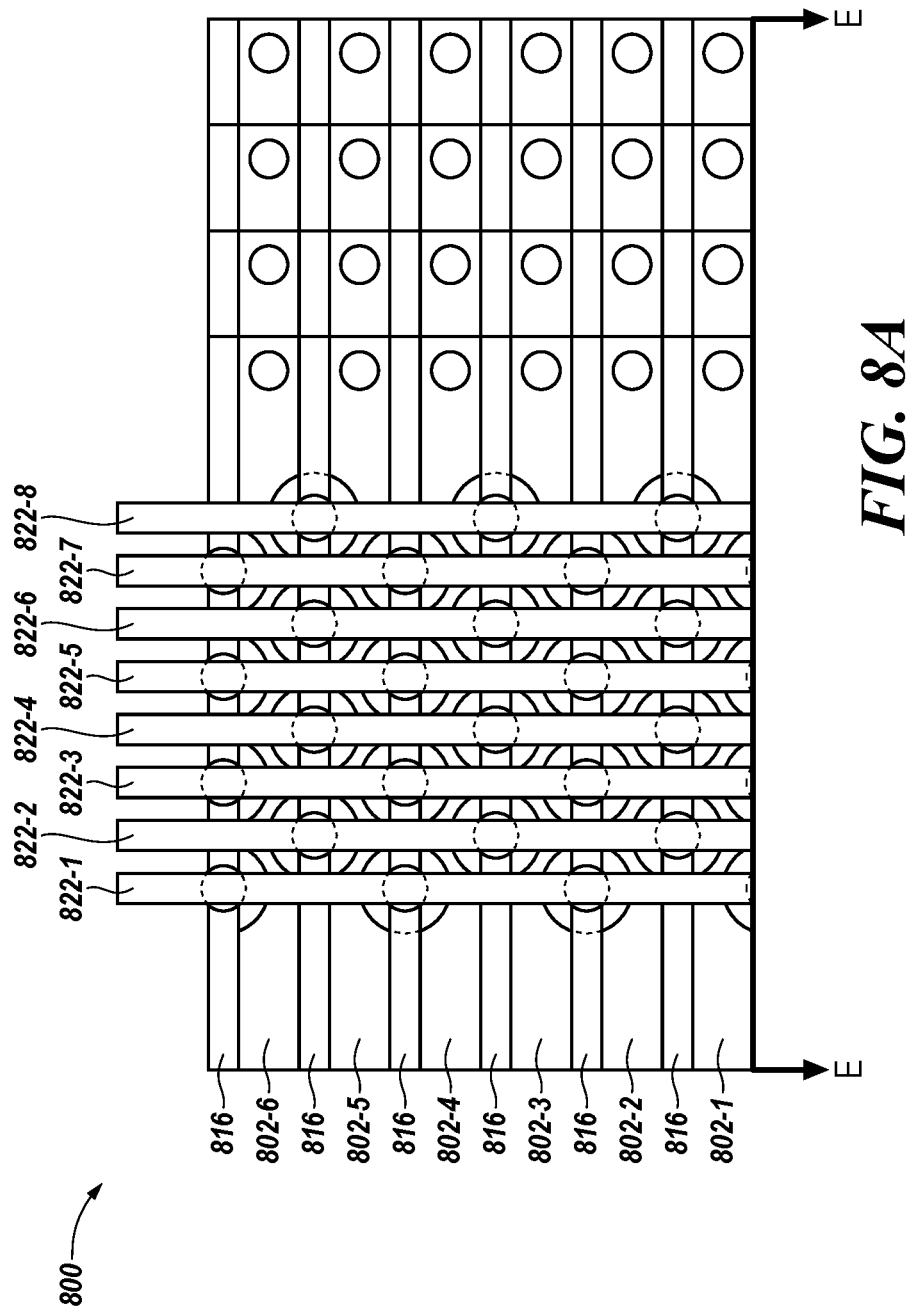

FIGS. 8A and 8B illustrate various views of a subsequent processing step associated with forming the 3-D memory array 800 in accordance with an embodiment of the present disclosure. FIG. 8A illustrates a top view of the 3-D memory array 800 after the subsequent processing step. FIG. 8B illustrates a schematic cross-sectional view of the 3-D memory array 800 along section line E-E after the subsequent processing step.

As shown in FIGS. 8A and 8B, a respective contact 828 is formed on each respective pair of conductive pillars 814 formed in each respective one of the plurality of enlarged openings 808. A plurality of conductive lines (e.g., vias) 822-1, 822-2, 822-3, 822-4, 822-5, 822-6, 822-7, and 822-8 (collectively referred to the plurality of conductive lines 822) are formed (e.g., deposited) on the contacts 828. The plurality of conductive lines 822 are formed in a y-direction such that alternating ones of the contacts 828 are coupled to each respective one of the plurality of conductive lines 822.

The conductive lines 802 associated with a respective one of the floors 824-1, 824-2, 824-3, and 824-4 (collectively referred to as the floors 824) have staggered lengths so as to form "steps" on a side of the 3-D memory array 800. As shown in FIGS. 8A and 8B, a respective contact 826 is coupled to each respective conductive line 802 of each of the floors 824. For example, the conductive lines 802 associated with the bottommost floor 824-1 are longer than the conductive lines 802 associated with the next floor 824-2, which are longer than the conductive lines 802 associated with the next floor 824-3, which are longer than the conductive lines 802 associated with the topmost floor 824-1. The contacts 826 are formed at or near an end of the conductive lines 802.

Figure 9A:
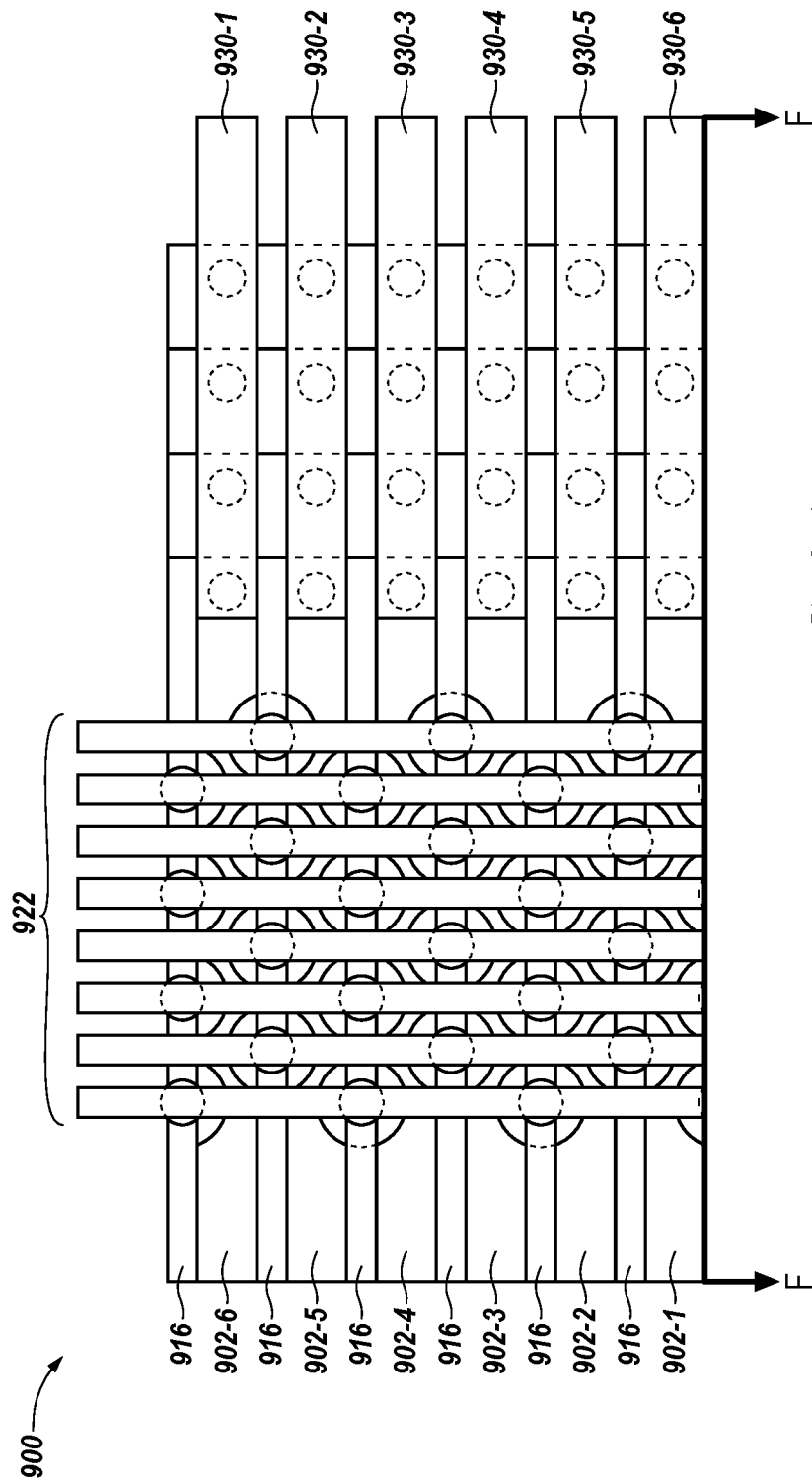
FIGS. 9A and 9B illustrate various views of a subsequent processing step associated with forming the 3-D memory array in accordance with an embodiment of the present disclosure.
Figure 9B:
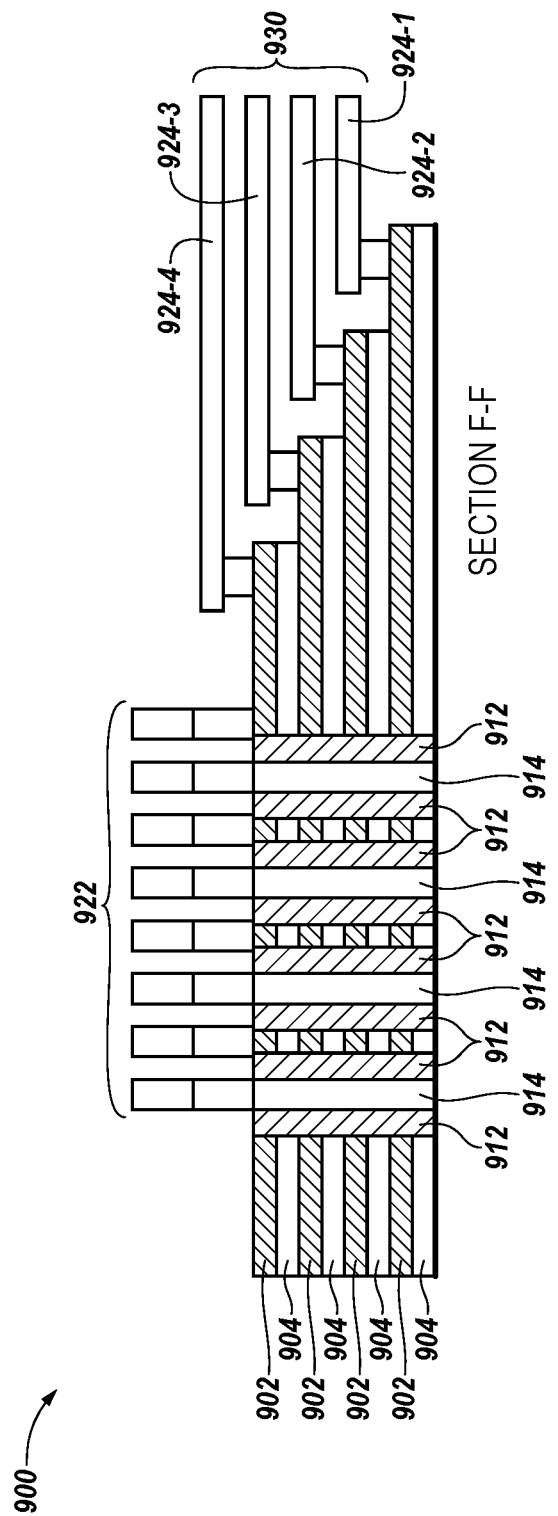

FIGS. 9A and 9B illustrate various views of a subsequent processing step associated with forming the 3-D memory array 900 in accordance with an embodiment of the present disclosure. FIG. 9A illustrates a top view of the 3-D memory array 900 after the subsequent processing step. FIG. 9B illustrates a schematic cross-sectional view of the 3-D memory array 900 along section line F-F after the subsequent processing step.

A metal material, such as a (third) plurality of conductive lines 930 (e.g., vias), is coupled to each respective contact 926 (not numbered in FIGS. 9A and 9B for clarity and so as not to obscure embodiments of the present disclosure). As illustrated in FIGS. 9A and 9B, the plurality of conductive lines 930 (e.g., vias) are formed (e.g., deposited) on each respective contact 926. For example, the conductive lines 930-1, 930-2, 930-3, 930-4, 930-5, and 930-6 are coupled to, via the contacts 926, the (first) plurality of conductive lines 902 associated with the topmost floor 924-4 of the 3-D memory array 900. In the embodiment illustrated in FIGS. 9A and 9B, the (third) plurality of conductive lines 930 are formed in an x-direction and substantially perpendicular to the (second) plurality of conductive lines 922.

The structure of the representative memory cell 920, which can be analogous to the memory cell 720 illustrated in FIG. 7, of the 3-D memory array 900 and the 3-D memory array 900 enables each respective memory cell 720 to be univocally addressed by one of the plurality of conductive lines 930 and one of the plurality of conductive lines 922. For example, to address the memory cell 920, indicated in FIG. 9A, of the topmost floor 924-4, a voltage can be applied to the conductive line 930-4 and the conductive line 922-6. The plurality of conductive lines 930 (and the conductive lines 902) can be word lines and the plurality of conductive lines 922 (and the conductive pillars 914) can be bit lines. Word lines may be referred to as access lines and bit lines may be referred to as data lines.

Because the memory cells of the 3-D memory array 900 can be univocally addressed by a single word line (WL) and a single bit line (BL), the quantity of decoder drivers to decode the 3-D memory array 900 is significantly reduced. Table 1 shows a comparison of the quantity of decoder drivers to decode previous 3-D memory arrays and the quantity of decoder drivers to decode 3-D memory arrays in accordance with the present disclosure, such as the 3-D memory array 900.

|  | Previous 3-D memory arrays | 3-D memory array 900 |
|---|---|---|
| # memory cells | # openings * # floors | # openings * 2 * # floors |
| # BL decoders | # openings in x-direction (N) * # openings in y-direction (M) | # openings in x-direction (N) |
| # WL decoders | # floors (L) | # floors (L) * # openings in y-direction (M) |
| Total # decoders | N*M + L | N + L*M |

Previous approaches may include one decoder driver for each opening formed in conductive line material formed in a plurality of planes. Thus, in previous approaches, the quantity of decoder drivers is dependent almost entirely on the quantity of openings formed in the conductive line material formed in a plurality of planes. The quantity of bit line decoders is the quantity of openings in the x-direction (N) multiplied by the quantity of openings in the y-direction (M). The quantity of word line decoders is the quantity of floors of the 3-D memory array. Thus, the total quantity of decoders is the sum of the quantity of bit line decoders (N*M) and the quantity of word line decoders (L).

In embodiments in accordance with the present disclosure, such as the 3-D memory array 900, the quantity of bit line decoders is the quantity of openings 908 in the x-direction (N). The quantity of bit line decoders can be based on only a quantity of vertical stacks in the x-direction. In the 3-D memory array 900, the quantity of openings 908 in the x-direction is 8 (4 openings in an upper staggered row, 4 openings in a lower staggered row). Thus, the quantity of bit line decoders is 8. The quantity of bit line decoders is equal to the quantity of the plurality of conductive lines 922. In embodiments in accordance with the present disclosure, the quantity of word line decoders is the quantity of openings 908 multiplied by the quantity of floors (L) multiplied by the quantity of openings 908 in the y-direction (M). Continuing the example of the 3-D memory array 900, the quantity of openings 908 in the y-direction is 6 (3 openings in a left staggered column, 3 openings in a right staggered column) and the quantity of floors is 4. Thus, the quantity of word line decoders is 24, which is the quantity of the plurality of conductive lines 930 (6 conductive lines in each of 4 floors).

In embodiments in accordance with the present disclosure, the total quantity of decoders for the 3-D memory array 900 is the sum of the quantity of bit line decoders (N) and the quantity of word line decoders (L*M). Thus, continuing the example of the 3-D memory array 900, the total quantity of decoders is 32 decoders (8+24). In contrast, some previous approaches to a 3-D memory array having 8 openings in the x-direction, 6 openings in the y-direction, and 4 floors would require 52 (8*6+4) decoders, which is 38% (20) more decoders than the 3-D memory array 900, even though the 3-D memory array 900 twice as many memory cells.

Figure 10:
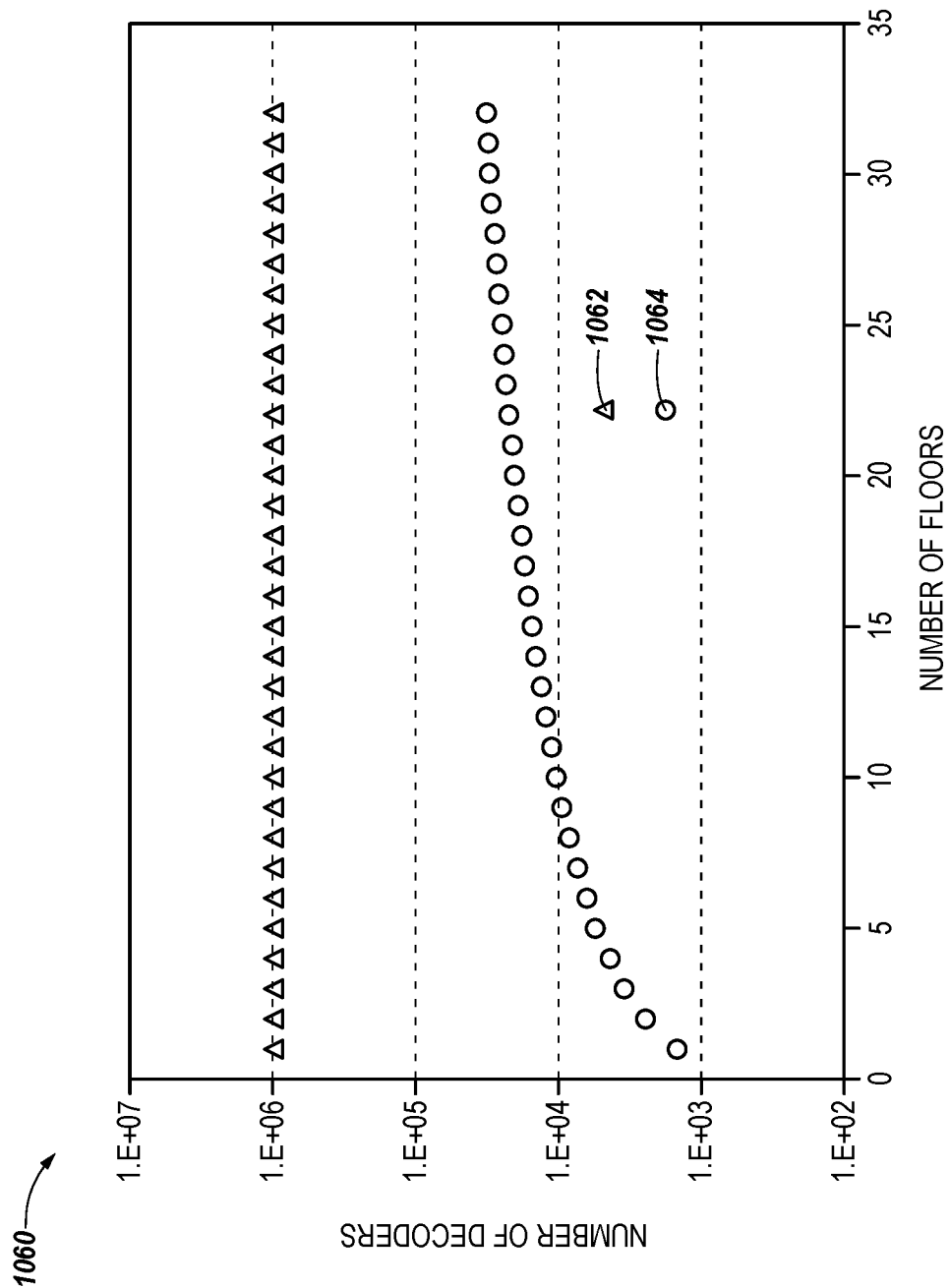
FIG. 10 is a graph showing a quantity of decoders for a quantity of floors of a 3-D memory array in accordance with an embodiment of the present disclosure.

FIG. 10 is a graph 1060 showing a quantity of decoders for a quantity of floors of a 3-D memory array in accordance with an embodiment of the present disclosure. The triangles 1062 correspond to a previous approach to a 3-D memory array having 1,000 openings in the x-direction and 1,000 openings in the y-direction. The circles 1064 correspond to a 3-D memory array in accordance with an embodiment of the present disclosure having 1,000 openings in the x-direction and 1,000 openings in the y-direction. The horizontal axis of the graph 1060 represents the number of floors in the 3-D memory array. The vertical axis of the graph 1060 represents the quantity of decoders for the 3-D memory array. As illustrated by the graph 1060, the previous approach requires approximately one million (1E6) decoders regardless of the quantity of floors of the 3-D memory array. In contrast, an embodiment in accordance with the present disclosure requires approximately 2,000 (2E3) decoders for a 3-D memory having one floor to approximately 50,000 (5E4) decoders for a 3-D memory array having thirty-two floors. In contrast to some previous approaches, not only is the quantity of decoders for decoding memory arrays (e.g., the 3-D memory array 900 illustrated in FIGS. 9A and 9B) in accordance with the present disclosure dependent on the number of floors of a 3-D memory array, but the quantity of decoders is reduced by at least 95% to 99.8%.

Figure 11:
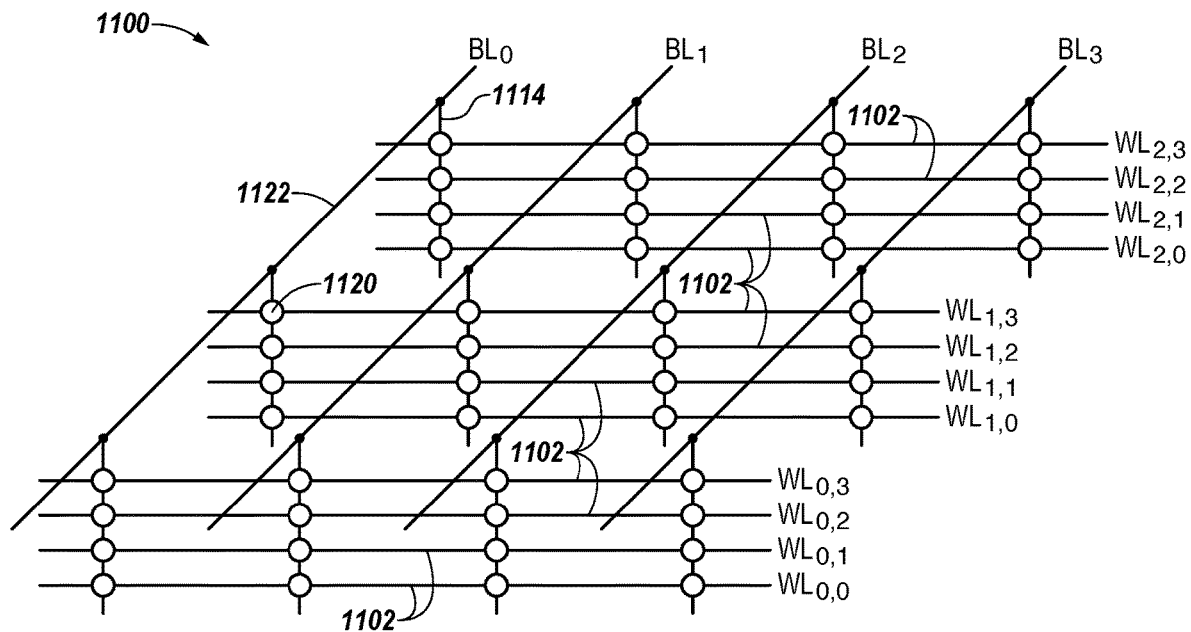
FIG. 11 illustrates a 3-D memory array in accordance with an embodiment of the present disclosure.

FIG. 11 illustrates a 3-D memory array 1100 in accordance with an embodiment of the present disclosure. The 3-D memory array 1100 can be can be analogous to the 3-D memory array 900 previously described in connection with FIGS. 9A and 9B, for example. That is, the 3-D memory array 1100 can be processed according to the processing steps previously described herein (e.g., in connection with FIGS. 1-9B).

As shown in FIG. 11, word lines can be disposed on a plurality of floors (e.g., levels, elevations, decks, planes). For example, word lines can be disposed on N floors. An insulation material (not shown in FIG. 11 for clarity and so as not to obscure embodiments of the present disclosure) can separate the floors of word lines. As such, the floors of word lines separated by the insulation material can form a stack of word lines/insulation materials.

Bit lines can be arranged substantially perpendicular to the word lines and located at a level above the N floors of word lines (e.g., at the N+1 level). Each bit line can include a conductive pillar (e.g., the conductive pillar 714 illustrated in FIG. 7) in proximity to the word lines (e.g., the word line 702), with a memory cell (e.g., the memory cell 720) formed between the conductive pillar and the word line.

For example, the 3-D memory array 1100 can include a plurality of conductive lines 1102 (e.g., word lines) and a plurality of conductive lines 1122 (e.g., bit lines). The plurality of conductive lines 1102 can be arranged into a plurality of floors. As illustrated in FIG. 11, the plurality of conductive lines 1102 are arranged into four floors. However, the quantity of floors into which the plurality of conductive lines 1102 can be arranged are not limited to this quantity; the plurality of conductive lines 1102 can be arranged into more, or fewer, floors. The plurality of conductive lines 1102 are arranged substantially parallel to one another within each respective floor. The plurality of conductive lines 1102 can be aligned vertically in a stack. For instance, the plurality of conductive lines 1102 in each of the multiple floors can be located at a same relative location within each respective floor so as to be aligned with the plurality of conductive lines 1102 in the floor directly above and/or below. Insulation material (e.g., the insulation material 104 previously described in connection with FIG. 1; not shown in FIG. 12) can be located between the floors at which the plurality of conductive lines 1102 are formed. An insulation material formed in the plurality of additional openings (e.g., the plurality of additional openings 616 previously described in connection with FIG. 6A-6C; not shown in FIG. 11) can be located between the plurality of conductive lines 1102 of each respective floor.

As shown in FIG. 11, the plurality of conductive lines 1122 can be arranged substantially parallel to one another at a floor different than the floors at which the plurality of conductive lines 1102 are located (e.g., above the floors at which the plurality of conductive lines 1102 are located). For instance, as illustrated in FIG. 10A, the plurality of conductive lines 1122 can be located at the top of the memory array 1100. As an additional example, the plurality of conductive lines 1122 can be located at the bottom of array 1100 (e.g., such that the plurality of conductive lines 1122 are coupled to the bottom of the conductive pillars 614 illustrated in FIGS. 6A-6C).

The indices shown in FIG. 11 for each of the plurality of conductive lines 1102 indicate a particular floor and the position (e.g., ordering) of the plurality of conductive lines 1102 within that floor. For example, the conductive line having the index $WL_{2,0}$ is located at position 2 within floor 0 (e.g., a word line of the 3-D memory array 1100 located at the bottom of a stack of word lines located at position 2). Th conductive line having the index $WL_{2,3}$ is located at position 2 within floor 3 (e.g., a word line of the 3-D memory array 1100 located at the top of a stack of word lines located at position 2). The quantity of floors into which the plurality of conductive lines 1102 can be arranged and the quantity of the plurality of conductive lines 1102 at each floor can be greater, or fewer, than the quantities shown in FIG. 11.

At each overlapping of one of the plurality of conductive lines 1122 and a stack of the plurality of conductive lines 1102, a conductive pillar 1114 is oriented substantially perpendicular to the plurality of conductive lines 1122 and the plurality of conductive lines 1102 so as to intersect a portion of each the plurality of conductive lines 1102 in the stack. The conductive pillars 1114 are formed near (e.g., adjacent) the plurality of conductive lines 1102, such that a memory cell 1120 is formed as previously described herein (e.g., in connection with FIG. 7).

The memory cells 1120 are arranged in a 3-D architecture near the location of where the conductive pillars 1114 and the plurality of conductive lines 1102 are in proximity to one another at different floors. As such, the memory cells 1120 can be arranged in multiple floors, each floor having memory cells at intersections of the conductive pillars 1114 and the plurality of conductive lines 1102. The floors of memory cells 1120 can be formed at different floors (e.g., vertically stacked). The 3-D memory array 1100 includes the memory cells 1120 having a common one of the plurality of conductive lines 1122, but separate ones of the plurality of conductive lines 1102. For instance, each respective memory cell 1120 can be substantially co-planar to its respective one of the plurality of conductive lines 1102. The memory cells 1120 can be formed substantially at the same floors as the plurality of conductive lines 1102. The memory cells 1120 of the 3-D memory array 1100 can be coupled to decoder circuitry (not shown in FIG. 11). The decoder circuitry can be used to select a particular one of the memory cells 1120 during a program or sense operation, for example, as described further in association with FIG. 12.

Figure 12:
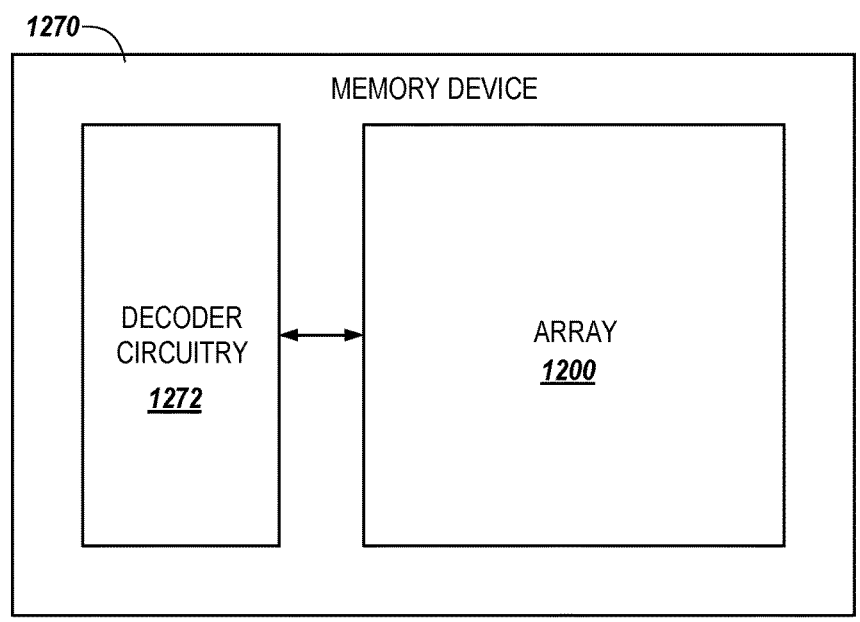
FIG. 12 is a block diagram of an apparatus in the form of a memory device in accordance with an embodiment of the present disclosure.

FIG. 12 is a block diagram of an apparatus in the form of a memory device 1270 in accordance with an embodiment of the present disclosure. As used herein, an "apparatus" can refer to, but is not limited to, any of a variety of structures or combinations of structures, such as a circuit or circuitry, a die or dies, a module or modules, a device or devices, or a system or systems, for example. As shown in FIG. 12, the memory device 1270 can include a memory array 1200. The memory array 1200 can be analogous the 3-D memory array 900 previously described in connection with FIGS. 9A and 9B respectively. Although FIG. 12 shows a single memory array 1200 for clarity and so as not to obscure embodiments of the present disclosure, the memory device 1270 may include any number of the memory array 1200.

As shown in FIG. 12, the memory device 1270 can include decoding circuitry 1272 coupled to the memory array 1200. As used herein, "decoder circuitry" can include and/or refer to row decoder circuitry and/or column decoder circuitry. The decoding circuitry 1272 can be included on the same physical device (e.g., the same die) as the memory array 1200. The decoding circuitry 1272 can be included on a separate physical device that is communicatively coupled to the physical device that includes the memory array 1200.

The decoding circuitry 1272 can receive and decode address signals to access the memory cells (e.g., the memory cells 1120 illustrated in FIG. 11) of the memory array 1200 during program and/or sense operations performed on the memory array 1200. For example, the decoding circuitry 1272 can include portions of decoder circuitry for use in selecting a particular memory cell of the memory array 1200 to access during a program or sense operation. For instance, a first portion of the decoder circuitry can be used to select a bit lit line (e.g., one of the plurality of conductive lines 922 illustrated in FIGS. 9A and 9B) and a second portion of the decoder circuitry can be used to select a word line (e.g., one of the plurality of conductive lines 924 illustrated in FIGS. 9A and 9B). The conductive pillar (e.g., the conductive pillar 714 illustrated in FIG. 7) of the memory cell (e.g., the memory cell 720) can be selected, for example, using a selector, such as a vertical transistor, coupled to the conductive pillar. The decoding circuitry 1272 can, during a program operation or sense operation performed on the memory array 1200, apply an access voltage to the first and the second conductive pillars (e.g., the conductive pillar 714) of one of the plurality of vertical stacks (e.g., the vertical stacks shown in and described in association with FIG. 13 above) and one of the plurality of conductive lines (e.g., one of the plurality of conductive lines 924)

The embodiment illustrated in FIG. 12 can include additional circuitry, logic, and/or components not illustrated so as not to obscure embodiments of the present disclosure. For example, the memory device 1270 can include a controller to send commands to perform operations on the memory array 1200, such as operations to sense (e.g., read), program (e.g., write), move, and/or erase data, among other operations. Further, the memory device 1272 can include address circuitry to latch address signals provided over input/output (I/O) connectors through I/O circuitry. Further, the memory device 1272 can include a main memory, such as, for instance, a DRAM or SDRAM, that is separate from and/or in addition to the memory array(s) 1200.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A three-dimensional (3-D) memory array, comprising:
a first plurality of conductive lines separated from one other by an insulation material;
a second plurality of conductive lines; and
a plurality of pairs of conductive pillars arranged in a staggered pattern through the first plurality of conductive lines and the insulation material;
wherein the conductive pillars of each respective pair are coupled to a same conductive line of the second plurality of conductive lines, and
wherein the staggered pattern comprises the plurality of pairs of conductive pillars being adjacent to and in line with each other in an x-direction, in line with each other in an y-direction, and nonadjacent to each other in the y-direction.

2. The 3-D memory array of claim 1, further comprising a plurality of memory cells, wherein each respective memory cell includes:
a portion of one of the conductive pillars of one of the plurality of pairs conductive pillars; and
a portion of a storage element material formed partially around that conductive pillar.

3. The 3-D memory array of claim 1, wherein the staggered pattern comprises the plurality of pairs of conductive pillars being arranged in a hexagonal pattern.

4. The 3-D memory array of claim 3, wherein:
the hexagonal pattern comprises one of the plurality of pairs of conductive pillars surround by six other ones of the plurality of pairs of conductive pillars; and
the six other ones of the plurality of pairs of conductive pillars are equidistant from one another and the one of the plurality of pairs of conductive pillars.

5. The 3-D memory array of claim 1, wherein a distance between each one of the plurality of pairs of conductive pillars is such that a density of the plurality of pairs of conductive pillars is at least 1.15 pillars per a unit of area.

6. A memory device, comprising:
a three-dimensional (3-D) memory array comprising a plurality of vertical stacks arranged in a staggered pattern, wherein each respective one of the plurality of vertical stacks includes:
a first conductive pillar arranged to extend substantially perpendicular to a plurality of conductive lines; and
a second conductive pillar arranged to extend substantially perpendicular to the plurality of conductive lines,
wherein the staggered pattern comprises the plurality of vertical stacks being adjacent to and in line with each other in an x-direction, in line with each other in an y-direction, and nonadjacent to each other in the y-direction; and
decoder circuitry coupled to the 3-D memory array and configured to select one of the plurality of conductive lines and one of the plurality of vertical stacks during a program operation or sense operation performed on the 3-D memory array.

7. The memory device of claim 6, further comprising a storage element material formed partially around the first conductive pillar and partially around the second conductive pillar.

8. The memory device of claim 7, wherein the storage element material formed partially around the first conductive pillar is separated from the storage element material formed partially around the second conductive pillar by an insulation material.

9. The memory device of claim 6, wherein the decoder circuitry is configured to select the one of the plurality of vertical stacks by applying an access voltage to the first and the second conductive pillars of the one of the plurality of vertical stacks.

10. The memory device of claim 6, wherein the decoder circuitry includes a plurality of decoders.

11. The memory device of claim 10, wherein a quantity of the plurality of decoders is based on a quantity of floors of the 3-D memory array.

12. The memory device of claim 10, wherein a quantity of the plurality of decoders is based on a quantity of the plurality of vertical stacks in the x-direction.

13. A three-dimensional (3-D) memory array, comprising:
a first conductive line material formed in a plurality of planes separated from one another by a first insulation material, wherein a plurality of openings are formed through the first conductive line material and the first insulation material in a staggered pattern,
wherein the staggered pattern comprises the plurality of openings being adjacent to and in line with each other in an x-direction, in line with each other in an y-direction, and nonadjacent to each other in the y-direction;
a storage element material formed in contact with a sidewall of each one of the plurality of openings; and
a second conductive line material formed as a pair of pillars in each one of the plurality of openings and contact with the storage element material.

14. The 3-D memory array of claim 13, further comprising a second insulation material formed in an additional opening through the second conductive line material and the storage element material formed in each respective opening.

15. The 3-D memory array of claim 14, wherein the first insulation material and the second insulation material are a same insulation material.

16. The 3-D memory array of claim 13, further comprising a metal material formed in contact with portions of the second conductive line material in each one of the plurality of openings.

17. The 3-D memory array of claim 13, wherein the staggered pattern comprises at least 1.15 pillars per a unit of area of the first conductive line material.

18. The 3-D memory array of claim 13, wherein a diameter of the plurality of openings is based on a dielectric thickness associated with a voltage to be applied to the 3-D memory array.

19. The 3-D memory array of claim 13, wherein a diameter of the plurality of openings is between approximately 40 and 80 nanometers, inclusive.

* * * * *